United States Patent
Goto et al.

(10) Patent No.: US 12,412,766 B2
(45) Date of Patent: Sep. 9, 2025

(54) SUBSTRATE PROCESSING APPARATUS AND SUBSTRATE PROCESSING METHOD

(71) Applicant: Tokyo Electron Limited, Tokyo (JP)

(72) Inventors: Shuhei Goto, Koshi (JP); Tomohiro Kaneko, Kumamoto (JP); Takeshi Matsumoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 589 days.

(21) Appl. No.: 17/756,853

(22) PCT Filed: Nov. 27, 2020

(86) PCT No.: PCT/JP2020/044378
§ 371 (c)(1),
(2) Date: Jun. 3, 2022

(87) PCT Pub. No.: WO2021/112022
PCT Pub. Date: Jun. 10, 2021

(65) Prior Publication Data
US 2023/0008278 A1    Jan. 12, 2023

(30) Foreign Application Priority Data
Dec. 6, 2019 (JP) ................. 2019-220954

(51) Int. Cl.
*H01L 21/677* (2006.01)
*B08B 3/02* (2006.01)
(Continued)

(52) U.S. Cl.
CPC ........ *H01L 21/67703* (2013.01); *B08B 3/022* (2013.01); *B08B 13/00* (2013.01); *F26B 5/005* (2013.01); *H01L 21/02057* (2013.01)

(58) Field of Classification Search
None
See application file for complete search history.

(56) References Cited

U.S. PATENT DOCUMENTS

| 5,801,945 A | 9/1998 | Comer |
| 2007/0003842 A1 | 1/2007 | Wang et al. |

(Continued)

FOREIGN PATENT DOCUMENTS

| CN | 109768001 A | 5/2019 |
| JP | 2006-190894 A | 7/2006 |

(Continued)

OTHER PUBLICATIONS

International Search Report for PCT/JP2020/044378 dated Feb. 9, 2021.

*Primary Examiner* — Sarah K Salerno
(74) *Attorney, Agent, or Firm* — Chrisman Gallo Tochtrop LLC

(57) ABSTRACT

A substrate processing apparatus 1 includes a controller 61 configured to perform a first recipe and a second recipe in parallel. Each of the first recipe and the second recipe includes a first transfer processing of transferring a substrate from a transit unit 14 to a liquid processing unit 17, a liquid processing, a second transfer processing of transferring the substrate from the liquid processing unit 17 to a drying unit 18 and a drying processing. The controller 61 determines, while the first recipe on a first substrate in substrates is being performed, when the second recipe on a second substrate in the substrates is started, a start timing of the first transfer processing of the second substrate such that a time period of the second transfer processing of the first substrate does not overlap with a time period of the second transfer processing of the second substrate.

9 Claims, 10 Drawing Sheets

(51) Int. Cl.
 B08B 13/00 (2006.01)
 F26B 5/00 (2006.01)
 H01L 21/02 (2006.01)

(56) References Cited

U.S. PATENT DOCUMENTS

2019/0139791 A1  5/2019  Kyose
2021/0043471 A1* 2/2021  Nakata .............. H01L 21/67253

FOREIGN PATENT DOCUMENTS

| | | |
|---|---|---|
| JP | 2013-012538 A | 1/2013 |
| JP | 2014-022546 A | 2/2014 |
| JP | 2014-033180 A | 2/2014 |
| KR | 10-2019-0038346 A | 4/2019 |

* cited by examiner

FIG. 11

| OPERATION | MOVEMENT SOURCE | MOVEMENT DESTINATION | WAFER HOLDING | OPERATION TIME |
|---|---|---|---|---|
| UNIT-FRONT MOVEMENT | LIQUID PROCESSING UNIT | DRYING UNIT | NO | a1 |
| | DRYING UNIT | TRANSIT UNIT | NO | a2 |
| | LIQUID PROCESSING UNIT | DRYING UNIT | YES | a3 |
| | DRYING UNIT | TRANSIT UNIT | YES | a4 |
| | ... | ... | ... | ... |
| WAFER RECEIPT | – | DRYING UNIT | – | a5 |
| | ... | ... | ... | ... |
| WAFER CARRY-OUT | – | TRANSIT UNIT | – | a6 |
| | ... | ... | ... | ... |

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/044378 filed on Nov. 27, 2020, which claims the benefit of Japanese Patent Application No. 2019-220954 filed on Dec. 6, 2019, the entire disclosures of which are incorporated herein by reference.

TECHNICAL FIELD

The various aspects and exemplary embodiments described herein pertain generally to a substrate processing apparatus and a substrate processing method.

BACKGROUND

Conventionally, there is known a substrate processing apparatus which forms an anti-drying liquid film on a surface of a semiconductor wafer (hereinafter, referred to as a "wafer") as a substrate and performs a drying processing by bringing the wafer having the liquid film formed thereon into contact with a processing fluid in a supercritical state.

Patent Document 1: Japanese Patent Laid-open Publication No. 2013-012538

SUMMARY

In one exemplary embodiment, a substrate processing apparatus includes a transit unit; multiple liquid processing units; multiple drying units; a transfer device and a controller. The transit unit is configured to accommodate therein multiple substrates. The multiple liquid processing units are configured to form a liquid film on a surface of the substrate. The multiple drying units are configured to dry the substrate by bringing the substrate having the liquid film formed on the surface thereof into contact with a supercritical fluid. The transfer device is configured to transfer the substrate. The controller is configured to control the transit unit, the multiple liquid processing units, the multiple drying units and the transfer device to perform two recipes, which includes a first recipe and a second recipe, in parallel, each of the first recipe and the second recipe including a first transfer processing of transferring the substrate from the transit unit to the liquid processing unit, a liquid processing performed by the liquid processing unit, a second transfer processing of transferring the substrate from the liquid processing unit to the drying unit and a drying processing performed by the drying unit, the first recipe and the second recipe having different processing times of at least the liquid processing and the drying processing. Further, the controller determines, while the first recipe on a first substrate in the multiple substrates is being performed, when the second recipe on a second substrate in the multiple substrates is started, a start timing of the first transfer processing of the second substrate such that a time period of the second transfer processing of the first substrate does not overlap with a time period of the second transfer processing of the second substrate.

BRIEF DESCRIPTION OF THE DRAWINGS

FIG. 11 illustrates an example of transfer time information.

DETAILED DESCRIPTION

Figure 1:
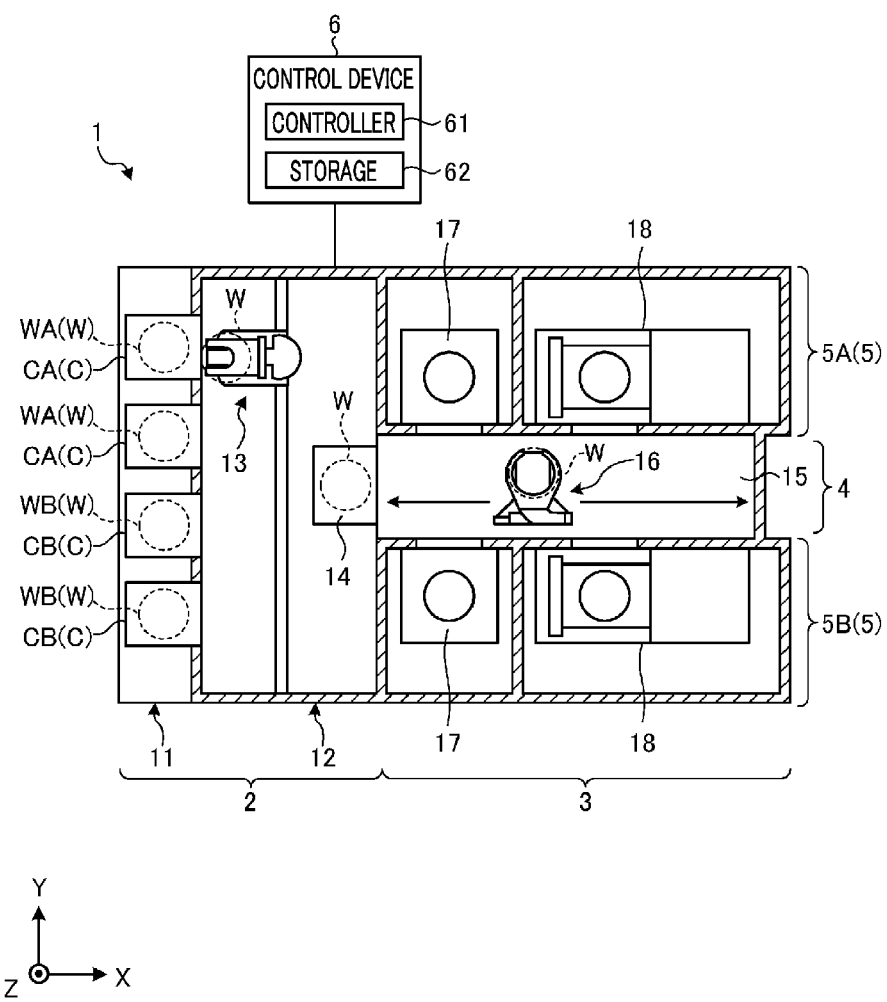
FIG. 1 is a schematic cross-sectional view of a substrate processing system according to an exemplary embodiment, when viewed from the top.

Hereinafter, embodiments (hereinafter, referred to as "exemplary embodiments") of a substrate processing apparatus and a substrate processing method according to the present disclosure will be described in detail with reference to the accompanying drawings. Further, the substrate processing apparatus and the substrate processing method of the present disclosure are not limited to the following exemplary embodiments. Furthermore, the exemplary embodiments can be appropriately combined as long as processing contents are not contradictory to each other. Also, in each of the embodiments described below, same parts will be assigned same reference numerals, and redundant description will be omitted.

In order to ease understanding of the following description, the X-axis direction, Y-axis direction and Z-axis direction which are orthogonal to each other are defined, and an orthogonal coordinate system in which the positive Z-axis direction is regarded as a vertically upward direction may be used in the following drawings. Further, a rotational direction around a vertical axis may be referred to as "θ direction".

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Conventionally, there is known a substrate processing apparatus which forms an anti-drying liquid film on a surface of a semiconductor wafer (hereinafter, referred to as a "wafer") as a substrate and performs a drying processing by bringing the wafer having the liquid film formed thereon into contact with a processing fluid in a supercritical state.

However, if another wafer is being transferred at a timing when the wafer having the liquid film formed on its surface is transferred into a subsequent drying unit, the wafer having the liquid film formed thereon is required to stand by until the transfer of the another wafer is completed.

If a state of the liquid film on the surface of the wafer is changed as the liquid film is dried or the like during the standby period, a problem such as a collapse of a pattern formed on the wafer may occur in a subsequent drying processing, which may cause a reduction in yield of wafers.

In particular, the overlap of wafer transfer timings described above is likely to occur when a plurality of recipes having different processing times is performed in parallel.

Therefore, even when a plurality of recipes having different processing times is performed in parallel, it is expected to suppress non-uniformity in transfer time of the wafer having the liquid film on its surface.

<Configuration of Substrate Processing System>

Figure 2:
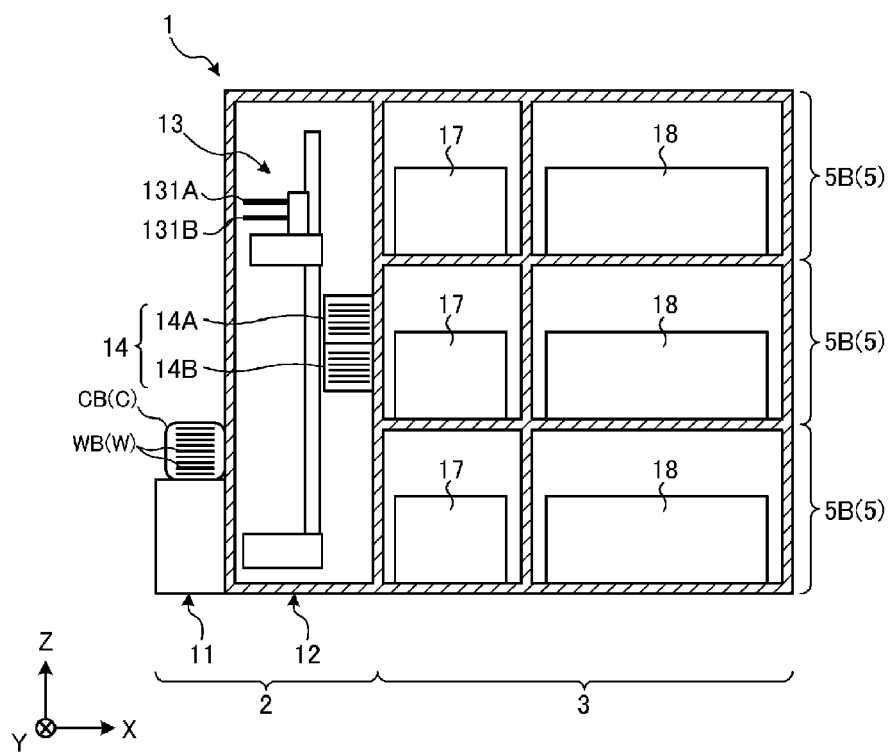
FIG. 2 is a schematic cross-sectional view of the substrate processing system according to the exemplary embodiment, when viewed from the lateral side.

First, a configuration of a substrate processing system 1 (an example of a substrate processing apparatus) according to an exemplary embodiment will be described with reference to FIG. 1 and FIG. 2. FIG. 1 is a schematic cross-sectional view of the substrate processing system 1 according to the exemplary embodiment, when viewed from the top. Also, FIG. 2 is a schematic cross-sectional view of the substrate processing system 1 according to the exemplary embodiment, when viewed from the lateral side.

As shown in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C each accommodating therein a plurality of semiconductor wafers W (hereinafter, referred to as "wafers W") horizontally is placed.

The substrate processing system 1 according to the exemplary embodiment is configured to perform substrate processings on two types of wafers W (hereinafter, referred to as "wafer WA" and "wafer WB") with different recipes, respectively. Therefore, the carrier placing section 11 is equipped with a plurality of (herein, two) carriers CA each accommodating therein a plurality of wafers WA and a plurality of (herein, two) carriers CB each accommodating therein a plurality of wafers WB.

It is assumed that one of the wafer WA and the wafer WB is a wafer W including a metal on its surface (pattern formation surface) and the other is a wafer W not including a metal on its surface. The wafer WA and the wafer WB just need to be wafers W having different processing times of at least a liquid processing and a drying processing, which will be described later, included in a recipe. That is, the term "different types" does not only refer to a difference in surface composition, but also includes a case where the processing times of the liquid processing and the drying processing are different even if the surface composition is the same (i.e., even if the wafers are of the same type).

The transfer section 12 is provided adjacent to the carrier placing section 11. In the transfer section 12, a transfer device 13 and a transit unit 14 are placed. As shown in FIG. 2, the transit unit 14 includes a transit unit 14A capable of accommodating therein the plurality of wafers WA in multiple levels and a transit unit 14B capable of accommodating therein the plurality of wafers WB in multiple levels. The transit unit 14A and the transit unit 14B are arranged along a vertical direction (Z-axis direction).

The transfer device 13 is provided with a wafer holding mechanism configured to hold the wafer W. The transfer device 13 is movable horizontally and vertically and pivotable around a vertical axis, and transfers the wafer W between the carrier C and the transit unit 14 by using the wafer holding mechanism.

Specifically, as shown in FIG. 2, the transfer device 13 includes a first holder 131A configured to hold the wafer WA and a second holder 131B configured to hold the wafer WB. The transfer device 13 may move the first holder 131A and the second holder 131B independently of each other in a horizontal direction.

The processing station 3 is provided adjacent to the transfer section 12. The processing station 3 is provided with a transfer block 4 and a plurality of processing blocks 5.

The transfer block 4 is provided with a transfer area 15 and a transfer device 16. The transfer area 15 is, for example, a rectangular parallelepiped region extending along an arrangement direction (X-axis direction) of the carry-in/out station 2 and the processing station 3. The transfer device 16 is placed in the transfer area 15.

Figure 3:
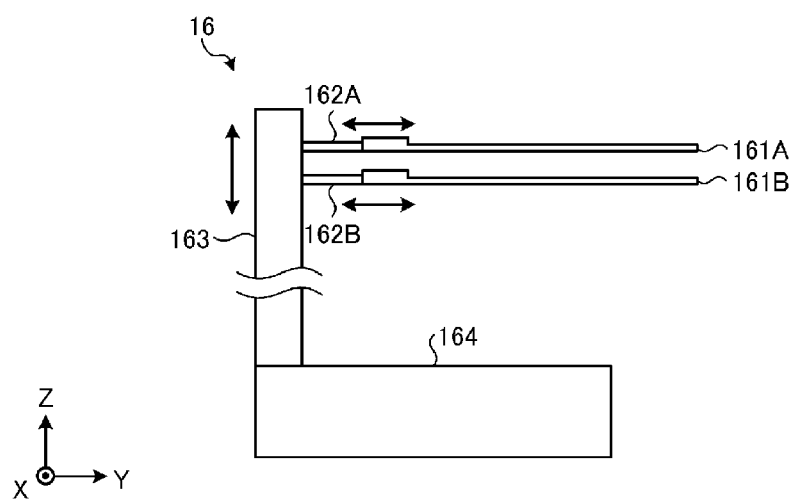
FIG. 3 is a side view showing a configuration of a transfer device according to the exemplary embodiment.

The transfer device 16 is provided with a wafer holding mechanism configured to hold the wafer W. The transfer device 16 is movable horizontally and vertically and pivotable around a vertical axis. The transfer device 16 is configured to transfer the wafer W between the transit unit 14 and the plurality of processing blocks 5 by using the wafer holding mechanism. Hereinafter, a configuration of the transfer device 16 will be described with reference to FIG. 3. FIG. 3 is a side view showing the configuration of the transfer device 16 according to the exemplary embodiment.

As shown in FIG. 3, the transfer device 16 according to the exemplary embodiment is equipped with a first holder 161A, a second holder 161B, a first reciprocating mechanism 162A, a second reciprocating mechanism 162B, an elevating mechanism 163 and a horizontal moving mechanism 164.

The first holder 161A is configured to hold the wafer WA. The second holder 161B is placed, for example, under the first holder 161A and configured to hold the wafer WB. Each of the first holder 161A and the second holder 161B is provided with, for example, a flat plate-shaped base portion having a bifurcated fork shape whose lateral width is smaller than a diameter of the wafer W and a plurality of supporting members provided on a surface of the base portion. Each of the first holder 161A and the second holder 161B supports the wafer W from below by using the plurality of supporting members to horizontally hold the wafer W.

The first reciprocating mechanism 162A is configured to move the first holder 161A back and forth along the horizontal direction, more particularly, along the Y-axis direction orthogonal to an extension direction of the transfer area 15. The second reciprocating mechanism 162B is configured to move the second holder 161B back and forth along the Y-axis direction.

The elevating mechanism 163 is configured to move the first reciprocating mechanism 162A and the second reciprocating mechanism 162B along the vertical direction to move the first holder 161A and the second holder 161B up and down. The horizontal moving mechanism 164 is configured to move the elevating mechanism 163 along the X-axis direction to move the first holder 161A and the second holder 161B in the extension direction of the transfer area 15.

The plurality of processing blocks 5 is placed on one side of the transfer area 15 to be adjacent to the transfer area 15. Specifically, as shown in FIG. 1 and FIG. 2, the plurality of processing blocks 5 includes a plurality of processing blocks 5A configured to process the wafer WA and a plurality of processing blocks 5B configured to process the wafer WB.

The processing blocks 5A are placed on one side (positive Y-axis direction side) of the transfer area 15 in a direction (Y-axis direction) orthogonal to the arrangement direction (X-axis direction) of the carry-in/out station 2 and the processing station 3, and the processing blocks 5B are placed on the other side (negative Y-axis direction side). Also, as shown in FIG. 2, the plurality of processing blocks 5A is disposed in multiple levels (herein, three levels) along the vertical direction. Likewise, the plurality of processing blocks 5B is disposed in multiple levels (herein, three levels) along the vertical direction.

The transfer of the wafer W between the processing block 5 in each level and the transit unit 14 is performed by the single transfer device 16 provided in the transfer block 4.

Each processing block 5A is equipped with a liquid processing unit 17 and a drying unit 18. Likewise, each processing block 5B is equipped with a liquid processing unit 17 and a drying unit 18.

The liquid processing unit 17 is configured to perform a cleaning processing of cleaning a top surface which is a pattern formation surface of the wafer W and then a liquid film forming processing of forming a liquid film on the top surface of the wafer W after being subjected to the cleaning processing. The cleaning processing and the liquid film forming processing are examples of the liquid processing. A configuration of the liquid processing unit 17 will be described later.

The drying unit 18 is configured to perform a drying processing on the wafer W after being subjected to the liquid film forming processing. Specifically, the drying unit 18 is configured to dry the wafer W after being subjected to the liquid film forming processing by bringing this wafer W into contact with a processing fluid in a supercritical state (hereinafter, sometimes referred to as "supercritical fluid"). A configuration of the drying unit 18 will be described later.

Further, although not illustrated in FIG. 1 and FIG. 2, the substrate processing system 1 may be further equipped with a supply unit configured to supply the processing fluid to the drying unit 18. The supply unit is equipped with a supply device group including a flowmeter, a flow rate controller, a back pressure valve, a heater and the like, and a housing accommodating therein the supply device group. In the present exemplary embodiment, the supply unit supplies the drying unit 18 with $CO_2$ as the processing fluid.

The liquid processing unit 17 and the drying unit 18 are arranged along the transfer area 15 (i.e., along the X-axis direction). In the liquid processing unit 17 and the drying unit 18, the liquid processing unit 17 is placed at a position close to the carry-in/out station 2 and the drying unit 18 is placed at a position far from the carry-in/out station 2.

As described above, each processing block 5 includes one liquid processing unit 17 and one drying unit 18. That is, the same numbers of liquid processing units 17 and the drying units 18 are provided in the substrate processing system 1.

As shown in FIG. 1, the substrate processing system 1 is equipped with a control device 6. The control device 6 is, for example, a computer and includes a controller 61 and a storage 62.

The controller 61 includes a microcomputer having a CPU (Central Processing Unit), a ROM (Read Only Memory), a RAM (Random Access Memory), an input/output port and the like, and various circuits. The CPU of the microcomputer reads out and executes a program stored in the ROM and thus implements controls over the transfer devices 13 and 16, the liquid processing unit 17, the drying unit 18 and the like.

Further, this program is stored in a computer-readable recording medium and may be installed to the storage 62 of the control device 6 from this recording medium. The computer-readable recording medium may be, for example, a hard disk (HD), a flexible disk (FD), a compact disk (CD), a magnet optical disk (MO) or a memory card.

The storage 62 may be, for example, a semiconductor memory device such as a RAM or a flash memory, or a storage device such as a hard disk or an optical disk.

<Configuration of Liquid Processing Unit>

Figure 4:
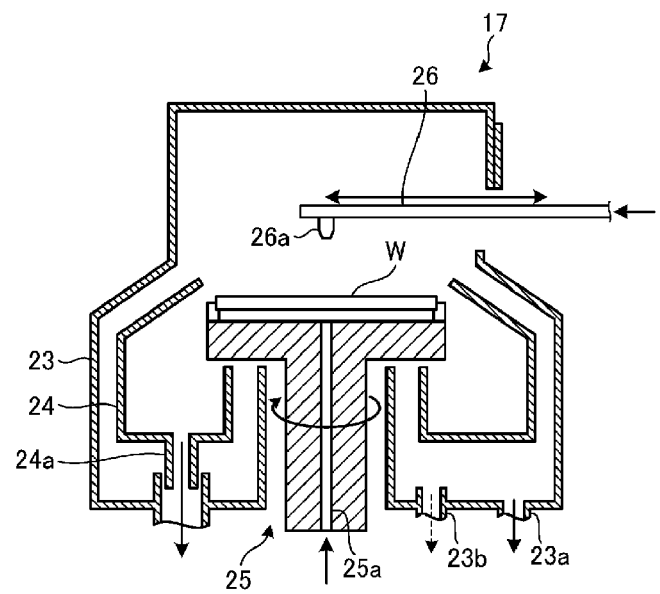
FIG. 4 illustrates a configuration example of a liquid processing unit.

Hereinafter, the configuration of the liquid processing unit 17 will be described with reference to FIG. 4. FIG. 4 illustrates a configuration example of the liquid processing unit 17. The liquid processing unit 17 is configured as a single-wafer cleaning device configured to clean the wafers W one by one by, for example, spin cleaning.

As shown in FIG. 4, the liquid processing unit 17 holds the wafer W substantially horizontally with a wafer holding mechanism 25 provided within an outer chamber 23 forming therein a processing space and rotates the wafer W by rotating the wafer holding mechanism 25 around a vertical axis.

Further, in the liquid processing unit 17, a nozzle arm 26 advances above the wafer W being rotated and, the cleaning processing on the top surface of the wafer W is performed by supplying a chemical liquid and a rinse liquid in a predetermined sequence from a chemical liquid nozzle 26a provided at a tip end of the nozzle arm 26.

Furthermore, in the liquid processing unit 17, a chemical liquid supply path 25a is formed within the wafer holding mechanism 25. A bottom surface of the wafer W is also cleaned by the chemical liquid and the rinse liquid supplied through this chemical liquid supply path 25a.

The cleaning processing may include, for example, a removal of particle or organic contaminant with the chemical liquid, a removal of oxide, a rinse cleaning with the rinse liquid (deionized water: hereinafter, referred to as "DIW") and the like. The liquid processing unit 17 configured to process the wafer WA and the liquid processing unit 17 configured to process the wafer WB are different from each other in, for example, the type of the used chemical liquid or the supply time of the chemical liquid.

The above-described various types of chemical liquids are received by the outer chamber 23 and an inner cup 24 disposed within the outer chamber 23, and then drained out from a drain port 23a provided at a bottom portion of the outer chamber 23 and a drain port 24a provided at a bottom portion of the inner cup 24. Further, the atmosphere within the outer chamber 23 is exhausted through an exhaust port 23b provided at the bottom portion of the outer chamber 23.

The liquid film forming processing is performed after the rinse processing in the cleaning processing. Specifically, the liquid processing unit 17 supplies IPA in a liquid state (hereinafter, sometimes referred to as "IPA liquid") on the top surface and the bottom surface of the wafer W while the wafer holding mechanism 25 is being rotated. Accordingly, the DIW remaining on the both surfaces of the wafer W is replaced by the IPA. Thereafter, the liquid processing unit 17 gradually stops the rotation of the wafer holding mechanism 25.

The wafer W after being subjected to the liquid film forming processing is delivered to the transfer device 16 by a non-illustrated delivery mechanism provided in the wafer holding mechanism 25 in a state in which a liquid film of the IPA liquid is formed on the top surface of the wafer W, and then, is carried out of the liquid processing unit 17.

The liquid film formed on the wafer W suppresses the occurrence of the pattern collapse caused by evaporation (vaporization) of the liquid on the top surface of the wafer W during a transfer of the wafer W into the drying unit 18 from the liquid processing unit 17 or during a carry-in operation of the wafer W into the drying unit 18. A processing time of the liquid film forming processing may be different between the liquid processing unit 17 configured to process the wafer WA and the liquid processing unit 17 configured to process the wafer WB.

<Configuration of Drying Unit>

Figure 5:
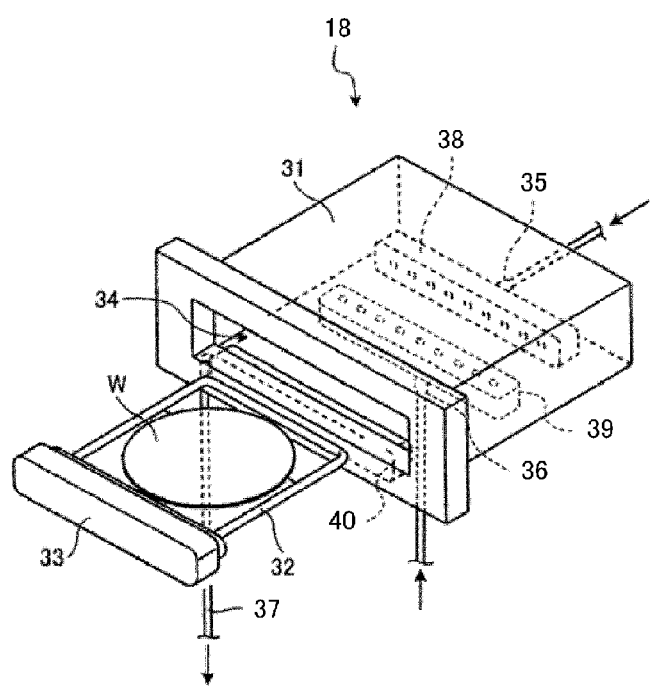
FIG. 5 illustrates a configuration example of a drying unit.

Hereinafter, a configuration of the drying unit 18 will be described with reference to FIG. 5. FIG. 5 illustrates a configuration example of the drying unit 18.

As shown in FIG. 5, the drying unit 18 includes a main body 31, a holding plate 32 and a lid member 33. The housing-shaped main body 31 is provided with an opening 34 through which the wafer W is carried in and out. The holding plate 32 is configured to horizontally hold the wafer W as a processing target. The lid member 33 is configured to support the holding plate 32 and hermetically seal the opening 34 when the wafer W is carried into the main body 31.

The main body 31 is a container in which a processing space capable of accommodating therein the wafer W having a diameter of, e.g., 300 mm is formed, and is provided with supply ports 35 and 36 and a discharge port 37 in the walls thereof. The supply ports 35 and 36 and the discharge port 37 are respectively connected to supply paths and a discharge path through which the supercritical fluid is circulated into the drying unit 18.

The supply port 35 is connected to a side surface opposite to the opening 34 in the housing-shaped main body 31. Further, the supply port 36 is connected to a bottom surface of the main body 31. The discharge port 37 is connected to a portion of the main body 31 under the opening 34. Although the two supply ports 35 and 36 and the single discharge port 37 are illustrated in FIG. 4, the number of supply ports 35 and 36 and the number of discharge port 37 are not particularly limited.

Further, fluid supply headers 38 and 39 and a fluid discharge header 40 are provided within the main body 31. Further, a plurality of supply openings is formed in the fluid supply headers 38 and 39 in a longitudinal direction of the fluid supply headers 38 and 39, and a plurality of discharge openings is formed in the fluid discharge header 40 in a longitudinal direction of the fluid discharge header 40.

The fluid supply header 38 is connected to the supply port 35 and provided adjacent to the side surface opposite to the opening 34 in the housing-shaped main body 31. Further, the plurality of supply openings formed in the fluid supply header 38 is directed toward the opening 34 side.

The fluid supply header 39 is connected to the supply port 36 and provided at a central portion of the bottom surface within the housing-shaped main body 31. Further, the plurality of supply openings formed in the fluid supply header 39 faces upwards.

The fluid discharge header 40 is connected to the discharge port 37 and provided adjacent to the side surface on the opening 34 side within the housing-shaped main body 31 and below the opening 34. Further, the plurality of discharge openings formed in the fluid discharge header 40 faces upwards.

The fluid supply headers 38 and 39 are configured to supply the supercritical fluid into the main body 31. Further, the fluid discharge header 40 is configured to guide and discharge the supercritical fluid within the main body 31 to the outside of the main body 31. Further, the supercritical fluid discharged to the outside of the main body 31 through the fluid discharge header 40 contains the IPA liquid dissolved in the supercritical fluid from the surface of the wafer W.

Within this drying unit 18, the IPA liquid between patterns formed on the wafer W is slowly dissolved in the supercritical fluid as it comes into contact with the supercritical fluid in a high pressure state (e.g., 16 MPa), and the IPA liquid between the patterns is gradually replaced by the supercritical fluid. Finally, gaps between the patterns are filled with only the supercritical fluid.

By decompressing the main body 31 to an atmospheric pressure from the high pressure state after the IPA liquid between the patterns is removed, the $CO_2$ is changed from the supercritical state to a gaseous state, so that the gaps between the patterns are occupied by only the gas. In this way, the IPA liquid between the patterns is removed and the drying processing of the wafer W is completed.

Here, the supercritical fluid has a smaller viscosity than a liquid (e.g., the IPA liquid) and has a higher ability to dissolve the liquid. Further, there is no interface between the supercritical fluid and the liquid or the gas in an equilibrium state with the supercritical fluid. Accordingly, in the drying processing with the supercritical fluid, the liquid can be dried without being affected by a surface tension. Therefore, according to the present exemplary embodiment, it is possible to suppress the occurrence of the pattern collapse during the drying processing.

A processing time of at least the drying processing is different between the liquid processing unit 17 configured to process the wafer WA and the liquid processing unit 17 configured to process the wafer WB.

Further, although it has been described in the present exemplary embodiment that the IPA liquid is used as the anti-drying liquid and $CO_2$ in the supercritical state is used as the processing fluid, a liquid other than the IPA may be used as the anti-drying liquid and a fluid other than $CO_2$ in the supercritical state may be used as the processing fluid.

<Substrate Processing Flow>

Figure 6:
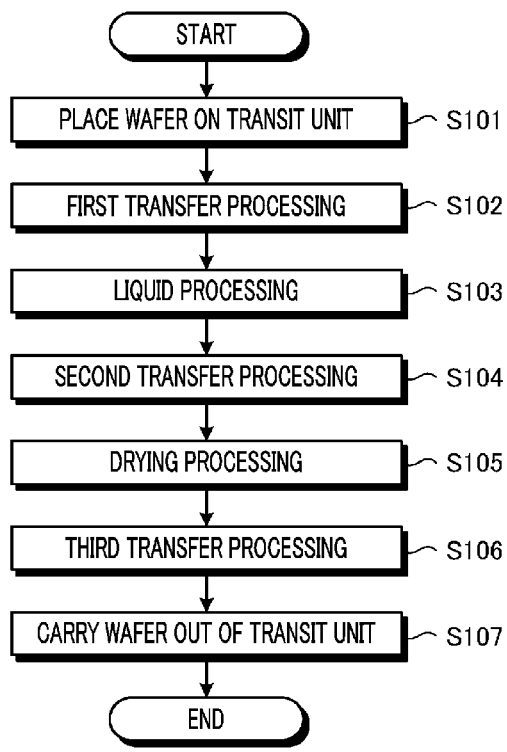
FIG. 6 is a flowchart illustrating a sequence of a series of substrate processings performed in the substrate processing system according to the exemplary embodiment.

Hereinafter, a processing flow of the wafer W in the substrate processing system 1 will be described with reference to FIG. 6. FIG. 6 is a flowchart illustrating a sequence of a series of substrate processings performed in the substrate processing system 1 according to the exemplary embodiment. The series of substrate processings shown in FIG. 6 are performed under the control of the controller 61.

Also, herein, a sequence of a series of substrate processings performed on a single wafer W is described as an example. In the substrate processing system 1, the series of substrate processings shown in FIG. 6 are performed in parallel on the plurality of wafers WA and the plurality of wafers WB.

In the substrate processing system 1, the transfer device 13 takes out a wafer W from the carrier C and places the wafer W on the transit unit 14 (process S101). Specifically, the transfer device 13 takes out a wafer WA from the carrier CA by using the first holder 131A and places the taken wafer WA on the transit unit 14A. Also, the transfer device 13 takes out a wafer WB from the carrier CB by using the second holder 131B and places the taken wafer WB on the transit unit 14B.

Then, in the substrate processing system 1, there is performed a first transfer processing (process S102). In the first transfer processing, the transfer device 16 takes out the wafer W from the transit unit 14 and transfers the wafer W to the liquid processing unit 17. Specifically, the transfer device 16 takes out the wafer WA from the transit unit 14A by using the first holder 161A and transfers the taken wafer WA to the liquid processing unit 17 of the processing block 5A. Also, the transfer device 16 takes out the wafer WB from the transit unit 14B by using the second holder 161B and transfers the taken wafer WB to the liquid processing unit 17 of the processing block 5B.

Thereafter, in the substrate processing system 1, the liquid processing unit 17 performs the liquid processing (process S103). Specifically, the liquid processing unit 17 removes the particle and the natural oxide film from the top surface of the wafer W, for example, by supplying various processing liquids onto the top surface of the wafer W which is the pattern formation surface. Then, the liquid processing unit 17 forms the liquid film of the IPA liquid on the top surface of the wafer W, for example, by supplying the IPA liquid onto the top surface of the wafer W after being subjected to the cleaning processing.

Subsequently, in the substrate processing system 1, there is performed a second transfer processing (process S104). In the second transfer processing, the transfer device 16 takes out the wafer W having the liquid film formed thereon from the liquid processing unit 17 and then transfers the wafer W to the drying unit 18. Specifically, the transfer device 16 takes out the wafer WA from the liquid processing unit 17 by using the first holder 161A and transfers the taken wafer WA to the drying unit 18 of the processing block 5A. Also, the transfer device 16 takes out the wafer WB from the liquid processing unit 17 by using the second holder 161B and transfers the taken wafer WB to the drying unit 18 of the processing block 5B.

Thereafter, in the substrate processing system 1, the drying unit 18 performs the drying processing (process S105). In the drying processing, the drying unit 18 dries the wafer W having the liquid film formed thereon by bringing the wafer W into contact with the supercritical fluid.

Then, in the substrate processing system 1, there is performed a third transfer processing (process S106). In the third transfer processing, the transfer device 16 takes the wafer W after being subjected to the drying processing from the drying unit 18 and transfers the wafer W to the transit unit 14. Specifically, the transfer device 16 takes out the wafer WA from the drying unit 18 by using the first holder 161A and places the taken wafer WA on the transit unit 14A. Also, the transfer device 16 takes out the wafer WB form the drying unit 18 by using the second holder 161B and places the taken wafer WB on the transit unit 14B.

Subsequently, in the substrate processing system 1, the transfer device 13 takes out the wafer W from the transit unit 14 and carries the wafer W into the carrier C (process S108). Specifically, the transfer device 13 takes out the wafer WA from the transit unit 14A by using the first holder 131A and places the taken wafer WA in the carrier CA. Also, the transfer device 13 takes out the wafer WB from the transit unit 14B by using the second holder 131B and places the taken wafer WB in the carrier CB. Upon the completion of this carry-out processing, the series of substrate processings on the single wafer W are ended.

As described above, in the substrate processing system 1, the series of substrate processings are performed in parallel on the plurality of wafers WA and the plurality of wafers WB. Processing times of at least the liquid processing (process S103) and the drying processing (process S105) are different between the series of substrate processings (process S101 to process S107) performed on the wafer WA and the series of substrate processings (process S101 to process S107) performed on the wafer WB.

Herein, if another wafer W is being transferred by the transfer device 16 at a timing when the second transfer processing of the wafer W after being subjected to the liquid processing is to be performed, the wafer W having the liquid film formed thereon is required to stand by until the transfer of the another wafer W is completed.

Further, if a state of the liquid film on the surface of the wafer W is changed as the liquid film is dried or the like during the standby period, the problem such as the collapse of the pattern formed on the wafer W may occur in the subsequent drying processing, which may cause the reduction in yield of wafers W. Such an overlap of wafer transfer timings is likely to occur particularly when a plurality of recipes having different processing times is performed in parallel as in the substrate processing system 1 according to the exemplary embodiment.

Therefore, in the present exemplary embodiment, a start timing of the first transfer processing of a subsequent wafer W is determined such that a time period of the second transfer processing of a preceding wafer W (e.g., the wafer WA) does not overlap with a time period of the second transfer processing of a subsequent wafer W (e.g., the wafer WB).

Accordingly, it is possible to suppress the transfer of the wafer WB by the transfer device 16 at a timing when the wafer WA after being subjected to the liquid processing is transferred. In other words, it is possible to suppress the occurrence of standby time of the wafer WA after being subjected to the liquid processing. Therefore, the substrate processing system 1 according to the exemplary embodiment can suppress the non-uniformity in transfer time of the wafer having the liquid film on its surface, i.e., the time period from the completion of the liquid processing to the carry-in of the wafer into the drying unit 18.

<Detail of Subsequent Recipe Start Timing Adjustment Processing>

Figure 7:
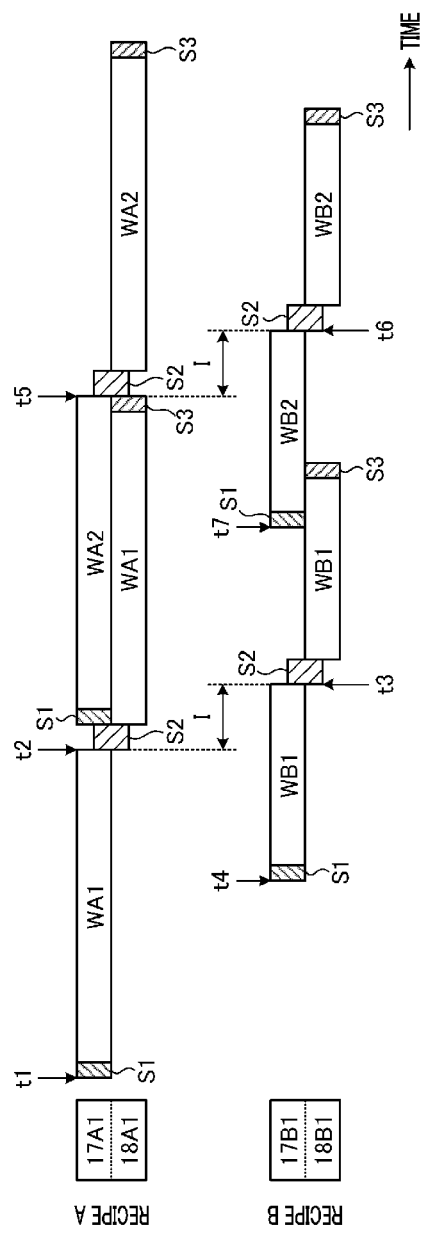
FIG. 7 is a timing chart for explaining a subsequent recipe start timing adjustment processing according to the exemplary embodiment.

This will be described in detail with reference to FIG. 7. FIG. 7 is a timing chart for explaining a subsequent recipe start timing adjustment processing according to the exemplary embodiment. The processings shown in FIG. 7 are performed under the control of the controller 61.

Hereinafter, the series of substrate processings performed on the wafer WA will be described as "recipe A" and the series of substrate processings performed on the wafer WB will be described as "recipe B". FIG. 7 illustrates an example of a timing chart when the recipe A and the recipe B are performed in parallel.

The timing chart for the recipe A in FIG. 7 shows an example where a plurality of wafers WA1 and WA2 is processed in this order in a pair of a liquid processing unit 17A1 and a drying unit 18A1 placed in the processing block 5A. Also, the timing chart for the recipe B in FIG. 7 shows an example where a plurality of wafers WB1 and WB2 is processed in this order in a pair of a liquid processing unit 17B1 and a drying unit 18B1 placed in the processing block 5B.

Further, FIG. 7 illustrates a processing period of the liquid processing on the wafer WA1 as "WA1" and a processing period of the liquid processing on the wafer WA2 as "WA2" in the liquid processing performed in the liquid processing unit 17A1. Also, FIG. 7 illustrates a processing period of the drying processing on the wafer WA1 as "WA1" and a processing period of the drying processing on the wafer WA2 as "WA2" in the liquid processing performed in the drying unit 18A1. The same is applied to the liquid processing unit 17B1 and the drying unit 18B1, and a processing period of the processing on the wafer WB1 is illustrated as "WB1" and a processing period of the processing on the wafer WB2 is illustrated as "WB2".

Further, FIG. 7 illustrates a processing period of the first transfer processing as "S1", a processing period of the second transfer processing as "S2" and a processing period of the third transfer processing as "S3".

For example, it is assumed that when the liquid processing is performed on the wafer WA1 in the liquid processing unit 17A1, the recipe B for the wafer WB1 can be started. In this case, if the recipe B for the wafer WB1 is started immediately, the second transfer processing of the wafer WA1 and the second transfer processing of the wafer WB1 may overlap with each other depending on the timing when the recipe B can be started.

Therefore, after the first transfer processing of the preceding wafer WA1 is started and before the first transfer processing of the subsequent wafer WB1 is started, the controller 61 determines a start timing of the first transfer processing of the wafer WB1 in the following order.

First, the controller 61 specifies an expected performance period of the second transfer processing of the wafer WA1 based on the processing times of the first transfer processing, the liquid processing and the second transfer processing of the wafer WA1. Specifically, all the processing times of the first transfer processing, the liquid processing and the second transfer processing of the wafer WA1 are already known. Further, the controller 61 may specify a time point at which the processing times of the first transfer processing and the liquid processing have elapsed from a start timing t1 of the first transfer processing of the wafer WA1 as an expected start timing t2 of the second transfer processing of the wafer WA1. Furthermore, the controller 61 may specify a time period in which the processing time of the second transfer processing has elapsed from the expected start timing t2 as the expected performance period of the second transfer processing of the wafer WA1.

Then, the controller 61 specifies an expected performance period of the second transfer processing of the wafer WB1 when it is assumed that the first transfer processing of the wafer WB1 is started, based on the processing times of the first transfer processing, the liquid processing and the second transfer processing of the wafer WB1. Specifically, all the processing times of the first transfer processing, the liquid processing and the second transfer processing of the wafer WB1 are already known. The controller 61 may specify a time point at which the processing times of the first transfer processing and the liquid processing have elapsed from, for example, a timing when the recipe B for the wafer WB1 can be started as an expected start timing t3 of the second transfer processing of the wafer WB1. Further, the controller 61 may specify a time period in which the processing time of the second transfer processing has elapsed from the expected start timing t3 as the expected performance period of the second transfer processing of the wafer WB1.

Then, the controller 61 determines whether an interval between the expected start timing t2 of the second transfer processing of the wafer WA1 and the expected start timing t3 of the second transfer processing of the wafer WB1 is shorter than a predetermined interval time I. The interval time I is set longer than at least the processing time of the second transfer processing.

If the interval is shorter than the interval time I, the controller 61 determines a timing when the interval is equal to or longer than the interval time I as a start timing t4 of the first transfer processing of the wafer WB1. Specifically, the controller 61 determines the start timing t4 of the first transfer processing of the wafer WB1 such that the interval becomes equal to the interval time I.

As described above, in the substrate processing system 1 according to the exemplary embodiment, the start timing of the first transfer processing of the wafer WB1 is determined such that the time period of the second transfer processing of the preceding wafer WA1 does not overlap with the time period of the second transfer processing of the subsequent wafer WB1.

Specifically, the first transfer processing of the wafer WB1 is started at a timing when an interval between the expected start timing t2 of the second transfer processing of the wafer WA1 and the expected start timing t3 of the second transfer processing of the wafer WB1 is equal to or longer than the interval time I.

Accordingly, it is possible to suppress the transfer of the wafer WB1 by the transfer device 16 at a timing when the second transfer processing of the wafer WA1 after being subjected to the liquid processing is performed. In other words, it is possible to suppress the occurrence of standby time of the wafer WA after being subjected to the liquid processing. Therefore, the substrate processing system 1 according to the exemplary embodiment can suppress the non-uniformity in transfer time of the wafer having the liquid film on its surface.

When the second transfer processing of the wafer WA1 is completed, the recipe A for the subsequent wafer WA2 can be performed. Here, the controller 61 specifies an expected start timing t5 of the second transfer processing of the wafer WA2 when it is assumed that the recipe A for the wafer WA2 is started immediately. Further, the controller 61 determines whether an interval between the expected start timing t3 of the second transfer processing of the preceding wafer WB1 and the expected start timing t5 of the second transfer processing of the subsequent wafer WA2 is shorter than the interval time I. In the illustrated example, the interval between the expected start timing t3 and the expected start timing t5 is equal to or longer than the interval time I. Therefore, the controller 61 starts the first transfer processing of the wafer WA2 at a timing when the recipe A for the wafer WA2 can be performed, i.e., when the second transfer processing of the wafer WA1 is completed.

The controller 61 also determines a start timing t7 of the first transfer processing of the wafer WB2 in the same procedure as described above. That is, the controller 61 determines the start timing t7 of the first transfer processing of the wafer WB2 such that an interval between the expected start timing t5 of the second transfer processing of the wafer WA2 and an expected start timing t6 of the second transfer processing of the wafer WB2 becomes equal to the interval time I.

In the above-described example, it is determined whether the interval between the expected start timing of the second transfer processing of the preceding wafer W and the expected start timing of the second transfer processing of the subsequent wafer W is shorter than the interval time I. However, the present disclosure is not limited thereto. For example, the controller 61 may determine whether an interval between an expected end timing of the second transfer processing of the preceding wafer W and the expected start timing of the second transfer processing of the subsequent wafer W is shorter than the interval time I. That is, the controller 61 may determine whether an interval between the expected performance period of the second transfer processing of the preceding wafer W and the expected performance period of the second transfer processing of the subsequent wafer W is shorter than the interval time I. In this case, the interval time I may be at least 0, and may be shorter than the interval time I which is set for the interval between the expected start timings.

Further, the interval between the expected start timing of the second transfer processing of the preceding wafer W and the expected start timing of the second transfer processing of the subsequent wafer W can be set equal to or longer than the interval time by the following two methods. A first method is to advance the expected start timing of the second transfer processing of the subsequent wafer W, and a second method is to delay the expected start timing of the second transfer processing of the subsequent wafer W. In this case, the controller 61 may adopt the method of delaying rather than the method of advancing. Accordingly, it is possible to suppress a processing of the subsequent wafer W from overtaking a processing of the preceding wafer W. Therefore, it is possible to suppress, for example, complexity of the system.

<Transfer Prohibition Period>

Figure 8:
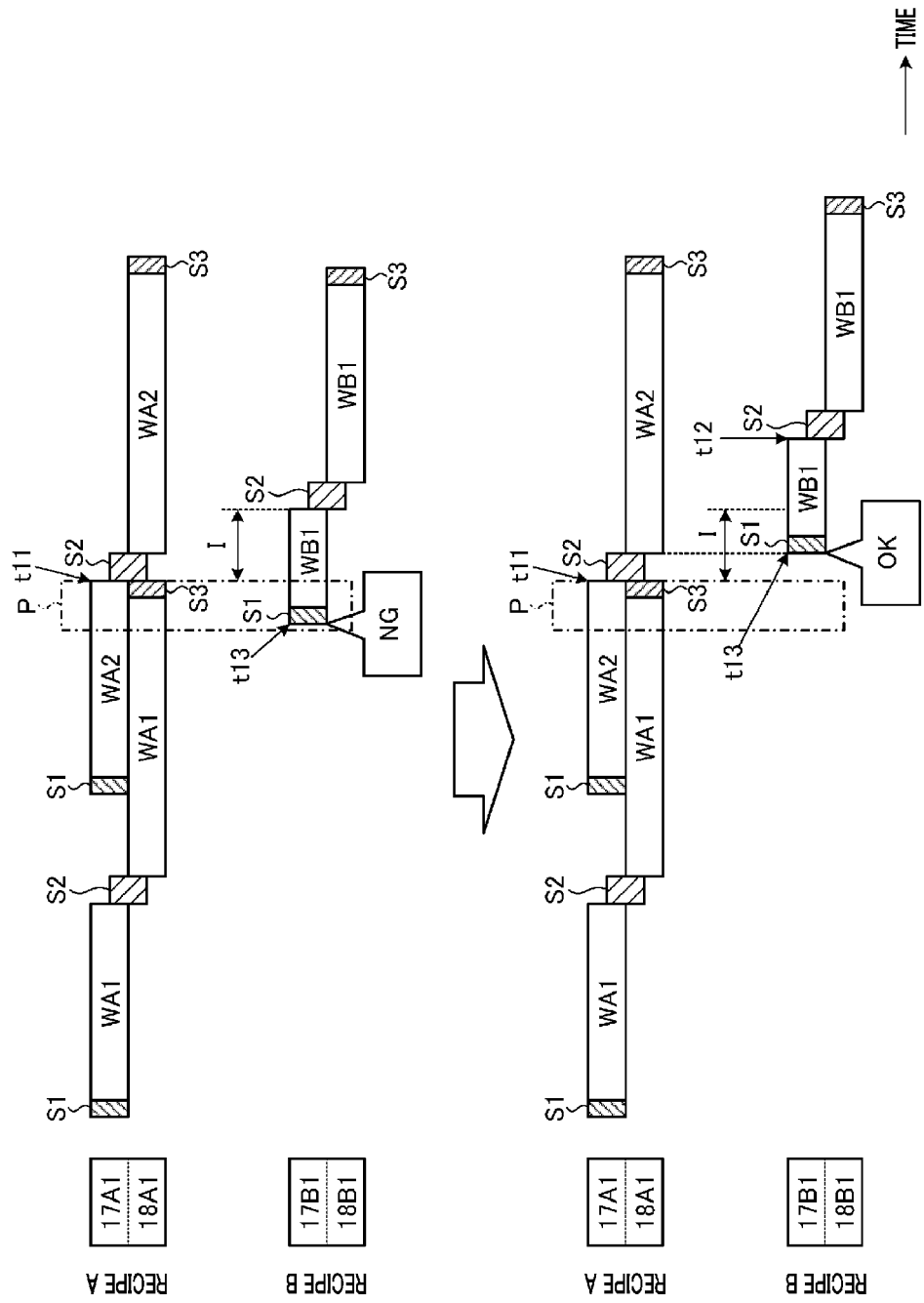
FIG. 8 is a timing chart for explaining an example of a subsequent recipe start timing adjustment processing in consideration of a transfer prohibition period.

Before the expected start timing of the second transfer processing of the preceding wafer W, the controller 61 may set a transfer prohibition period ending at the expected start timing. This will be described with reference to FIG. 8. FIG. 8 is a timing chart for explaining an example of a subsequent recipe start timing adjustment processing in consideration of a transfer prohibition period. The processings shown in FIG. 8 are performed under the control of the controller 61.

The upper chart in FIG. 8 shows an example where the start timing t13 of the first transfer processing of the subsequent wafer WB1 is included in a transfer prohibition period P. The lower chart in FIG. 8 shows an example where the start timing t13 is delayed such that the start timing t13 of the first transfer processing of the subsequent wafer WB1 is not included in the transfer prohibition period P.

As shown in FIG. 8, before an expected start timing t11 of the second transfer processing of the preceding wafer WA2, the transfer prohibition period P ending at the expected start timing t11 is set. First, the controller 61 temporarily determines a start timing t13 of the first transfer processing of the wafer WB1. The start timing t13 is temporarily determined such that an interval between the expected start timing t11 of the second transfer processing of the preceding wafer WA2 and an expected start timing t12 of the second transfer processing of the subsequent wafer WB1 becomes equal to the interval time I. Then, the controller 61 determines whether the temporarily determined start timing t13 is included in the transfer prohibition period P.

If the temporarily determined start timing t13 is included in the transfer prohibition period P as shown in the upper chart in FIG. 8, the controller 61 delays the temporarily determined start timing t13 such that the start timing t13 does not overlap with the transfer prohibition period P as shown in the lower chart in FIG. 8. Specifically, the controller 61 starts the first transfer processing of the wafer WB1 at a timing when the interval between the expected start timings t11 and t12 is equal to or longer than the interval time I and the start timing t13 does not overlap with the transfer prohibition period P. Herein, the first transfer processing of the wafer WB1 cannot be started until the second transfer processing of the wafer WA2 is ended. Therefore, the first transfer processing of the wafer WB1 is started at a timing when the second transfer processing of the wafer WA2 is ended.

As described above, the transfer prohibition period P may be set right before the expected start timing of the second transfer processing of the preceding wafer W, and a transfer of another wafer W may be prohibited in the transfer prohibition period P. Accordingly, the second transfer processing of the preceding wafer W can be started more reliably at the expected start timing. Also, if the preceding wafer WA1 is present in the drying unit 18A1 as the carry-in destination of the wafer WA2, the subsequent wafer WA2 cannot be carried into the drying unit 18A1. For this reason, the processing of carrying the preceding wafer WA1 out of the drying unit 18B1, i.e., the third transfer processing of the wafer WA1, is allowed to be performed in the transfer prohibition period P.

<Method of Determining Start Timing of First Transfer Processing in Same Recipe>

Figure 9:
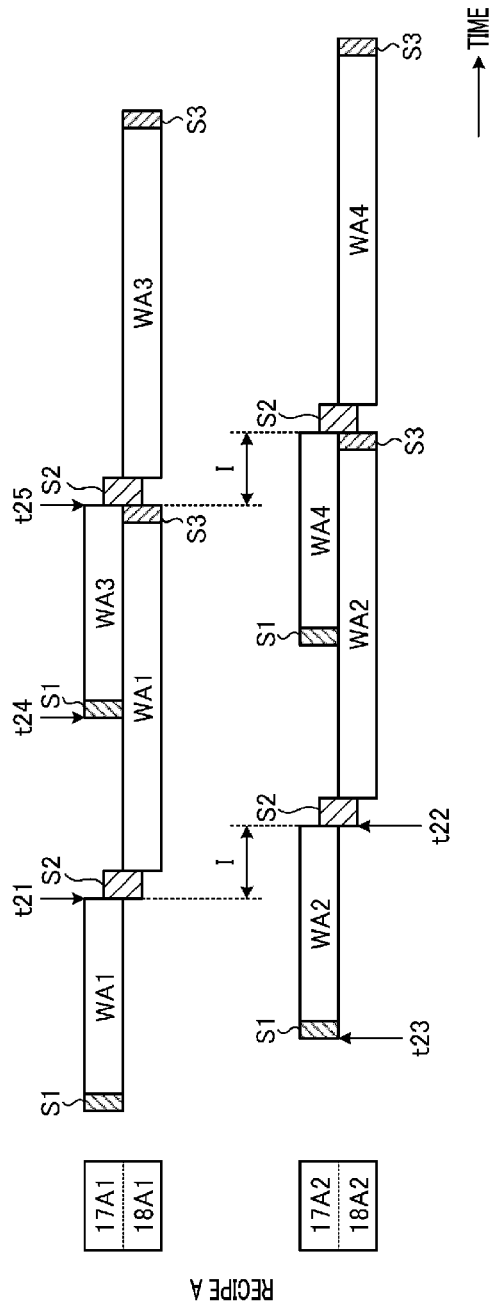
FIG. 9 is a timing chart for explaining an example of a method of determining a start timing of a first transfer processing in the same recipe.

In the above-described example, the start timing of the first transfer processing between the different recipes A and B is determined based on the interval time I. However, the present disclosure is not limited thereto. A start timing of the first transfer processing in the same recipe may also be determined based on the interval time I. This will be described in detail with reference to FIG. 9. FIG. 9 is a timing chart for explaining an example of a method of determining a start timing of a first transfer processing in the same recipe. The processings shown in FIG. 9 are performed under the control of the controller 61.

FIG. 9 shows an example where a plurality of wafers WA1 and WA3 is processed in this order in a pair of the liquid processing unit 17A1 and the drying unit 18A1 placed in the processing block 5A. Also, FIG. 9 shows an example where a plurality of wafers WA2 and WA4 is processed in this order in a pair of a liquid processing unit 17A2 and a drying unit 18A2 placed in the processing block 5A.

As shown in FIG. 9, the controller 61 specifies an expected start timing t21 of the second transfer processing of the preceding wafer WA1 and an expected start timing t22 of the second transfer processing of the subsequent wafer WA2. Further, the controller 61 determines a start timing t23 of the first transfer processing of the wafer WA2 such that an interval between the expected start timings t21 and t22 becomes equal to the interval time I.

As described above, the controller 61 may determine the start timing of the first transfer processing of the subsequent wafer WA with respect to the wafers WA processed according to the same recipe (herein, the recipe A) such that the interval between expected start timings of the second transfer processing becomes equal to or longer than the interval time. The same is applied between the wafers WA2 and WA3 and between the wafers WA3 and WA4.

Also, the controller 61 may determine a start timing t24 of the first transfer processing of the subsequent wafer WA3 with respect to the wafers WA1 and WA3 processed in the pair of the liquid processing unit 17A1 and the drying unit 18A1 in the following order.

First, the controller 61 specifies an expected end timing t25 of the third transfer processing of the preceding wafer WA1 based on the already-known processing time of the third transfer processing. Then, the controller 61 determines the start timing t24 of the first transfer processing of the subsequent wafer WA3 such that the second transfer processing of the wafer WA3 is started at the expected end timing t25. In other words, the controller 61 determines the start timing t24 of the first transfer processing of the subsequent wafer WA3 such that the end timing of the third transfer processing of the preceding wafer WA1 is the same as the start timing of the second transfer processing of the subsequent wafer WA3.

Accordingly, the start of the second transfer processing of the subsequent wafer WA3 is delayed, for example, until the third transfer processing of the preceding wafer WA1 is ended. Therefore, it is possible to suppress the non-uniformity in processing time of the second transfer processing of the wafer WA3. Also, since the end timing of the third transfer processing of the preceding wafer WA1 is set to be same as the start timing of the second transfer processing of the subsequent wafer WA3, it is possible to efficiently transfer the wafers WA1 and WA3.

However, the end timing of the third transfer processing of the preceding wafer WA1 is not necessarily same as the start timing of the second transfer processing of the subsequent wafer WA3. That is, the controller 61 may determine the start timing t24 of the first transfer processing of the wafer WA3 such that the liquid processing of the subsequent wafer WA3 is ended within a predetermined period of time after the third transfer processing of the preceding wafer WA1 is ended.

<Method of Determining Priority when Two Recipes can be Started>

When both the recipe A and the recipe B can be started, the controller 61 may priorly perform a recipe other than the recipe performed last between the recipe A and the recipe B.

Figure 10:
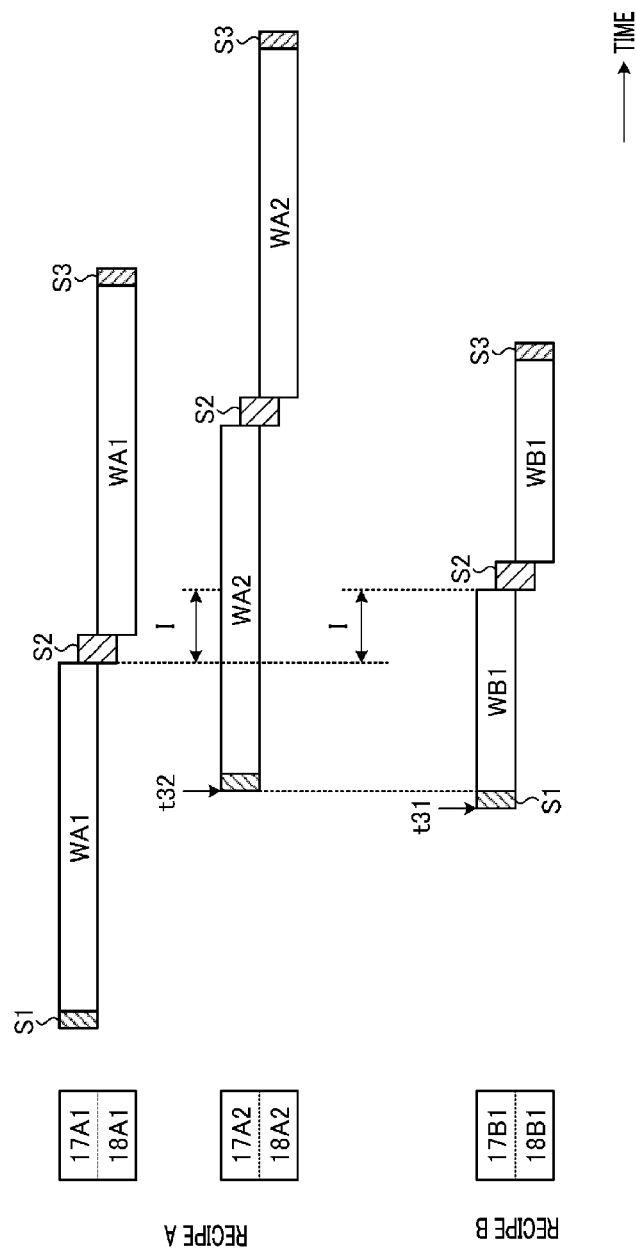
FIG. 10 is a timing chart for explaining an example of a method of determining a priority when two recipes can be started.

This will be described in detail with reference to FIG. 10. FIG. 10 is a timing chart for explaining an example of a method of determining a priority when two recipes can be started. The processings shown in FIG. 10 are performed under the control of the controller 61.

FIG. 10 shows an example where the WA1 is processed in the pair of the liquid processing unit 17A1 and the drying unit 18A1 placed in the processing block 5A. Also, FIG. 10 shows an example where the wafer WA2 is processed in the pair of the liquid processing unit 17A2 and the drying unit 18A2 placed in the processing block 5A. Further, FIG. 10 shows an example where the wafer WB1 is processed in the pair of the liquid processing unit 17B1 and the drying unit 18B1 placed in the processing block 5B.

As shown in FIG. 10, it is assumed that both the wafer WA2 processed according to the recipe A and the wafer WB1 processed according to the recipe B can be selected as a wafer W subsequent to the preceding wafer WA1. In this case, the preceding wafer WA1 is the wafer WA processed according to the recipe A, and, thus, the controller 61 priorly starts a processing of the wafer WB1 processed according to the recipe B as the subsequent wafer W. Specifically, the controller 61 first starts the first transfer processing of the wafer WB1 at a start timing t31, and then, starts the first transfer processing of the wafer WA2 at a start timing t32. The start timing t32 is also an end timing of the first transfer processing of the wafer WB1.

As described above, when both the recipe A and the recipe B can be started, the controller 61 may priorly start performing a recipe other than the recipe performed last between the recipe A and the recipe B. Accordingly, it is possible to suppress the difference in progress between the recipe A and the recipe B.

<Transfer Time>

Figure 12:
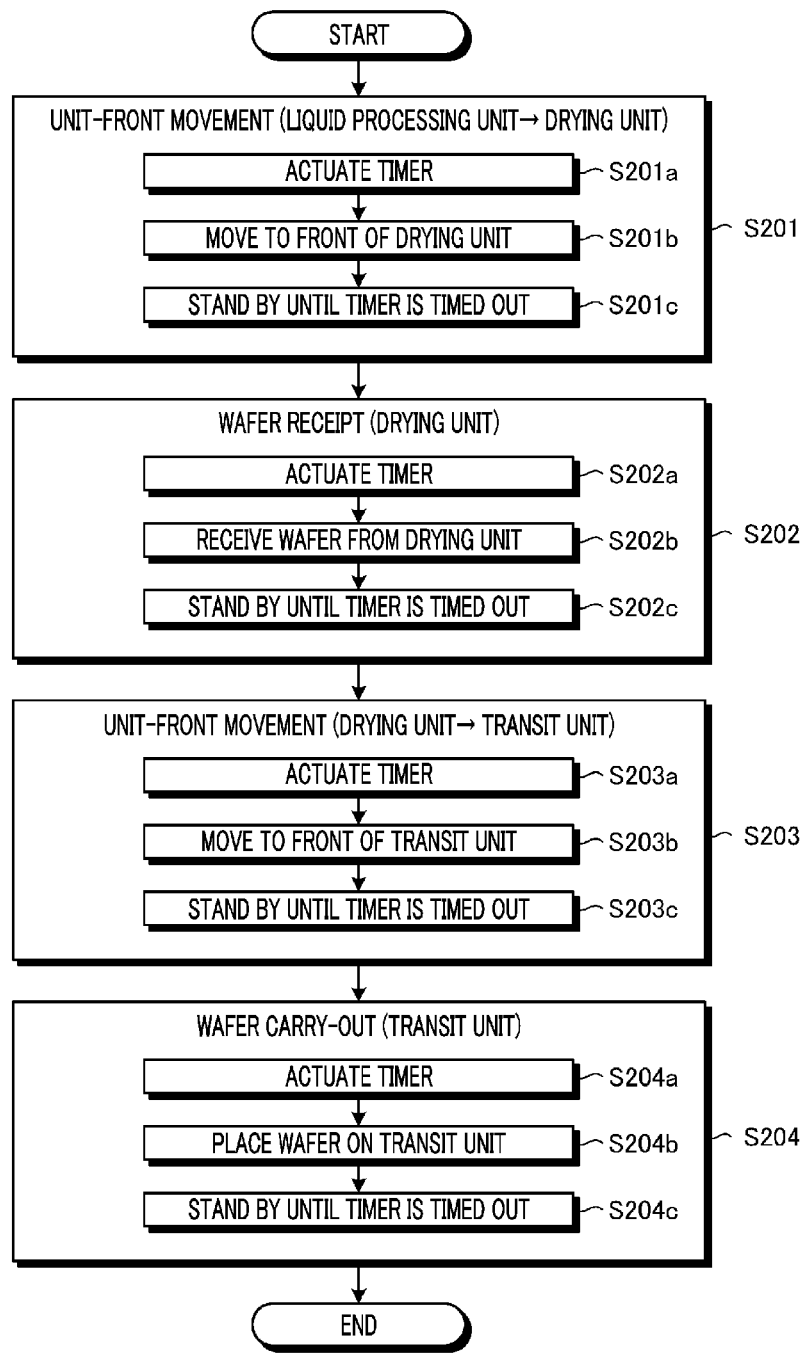
FIG. 12 is a flowchart illustrating an example of a sequence of a third transfer processing.

Processing times of the first transfer processing, the second transfer processing and the third transfer processing (hereinafter, referred to as "transfer times") may be previously fixed. This will be described in detail with reference to FIG. 11 and FIG. 12. FIG. 11 illustrates an example of transfer time information. Also, FIG. 12 is a flowchart illustrating an example of a sequence of a third transfer processing. The processings shown in FIG. 12 are performed under the control of the controller 61.

The storage 62 of the control device 6 previously stores therein, for example, transfer time information shown in FIG. 11. As shown in FIG. 11, the transfer time information is information in which the time (operation time) from the start to the end of an operation is associated with each individual operation for transfer.

Specifically, each of the first transfer processing, the second transfer processing and the third transfer processing includes "unit-front movement", "wafer receipt" and "wafer carry-out" as individual operations. The "unit-front movement" is an operation of moving the transfer device 16 from a certain movement source to a certain movement destination. The "wafer receipt" is an operation of receiving the wafer from the movement destination. The "wafer carry-out" is an operation of delivering the wafer to the movement destination.

For example, according to the transfer time information shown in FIG. 11, the operation time of the unit-front movement from the liquid processing unit 17 to the drying unit 18 is defined as "a1" in case that wafer holding is "absence" and "a3" in case that the wafer holding is "presence". The operation time "a3" is set longer than the operation time "a1". This is to ensure that the moving speed in a state where the wafer W is held is lower than the moving speed in a state where the wafer W is not held from the viewpoint of suppressing the misalignment of the wafer W. Likewise, according to the transfer time information shown in FIG. 11, the operation time of the unit-front movement from the drying unit 18 to the transit unit 14 is defined as "a2" in case that the wafer holding is "absence" and "a4" in case that the wafer holding is "presence".

Further, according to the transfer time information shown in FIG. 11, the operation time of the "wafer receipt" of receiving the wafer W from the drying unit 18 is defined as "a5", and the operation time of the "wafer carry-out" of placing the wafer W on the transit unit 14 is defined as "a6".

Hereinafter, an example where the third transfer processing is performed according to the transfer time information will be described with reference to FIG. 12. As shown in FIG. 12, the controller 61 performs the unit-front movement from the liquid treatment unit 17 to the drying unit 18 (process S201), and then, performs the wafer receipt from the drying unit 18 (process S202). Thereafter, the controller 61 performs the unit-front movement from the drying unit 18 to the transit unit 14 (process S203), and then, performs the wafer carry-out to the transit unit 14 (process S204).

In the process S201, the controller 61 first actuates a timer for the operation time "a1" (process S201*a*). Subsequently, the controller 61 moves the transfer device 16 to the front of the drying unit 18 (process S201*b*). Then, the controller 61 makes the transfer device 16 stand by in front of the drying unit 18 until the timer for "a1" actuated in the process S201*a* is timed out (process S201*c*).

When the timer for "a1" is timed out in the process S201*c*, the controller 61 starts the process S202. In the process S202, the controller 61 first actuates a timer for the operation time "a5" (process S202*a*). Subsequently, the controller 61 receives the wafer W from the drying unit 18 (process S202*b*). Then, the controller 61 makes the transfer device 16 stand by in front of the drying unit 18 until the timer for "a5" actuated in the process S202*a* is timed out (process S202*c*).

When the timer for "a5" is timed out in the process S202*c*, the controller 61 starts the process S203. In the process S203, the controller 61 first actuates a timer for the operation time "a4" (process S203*a*). Subsequently, the controller 61 moves the transfer device 16 to the transit unit 14 (process S203*b*). Then, the controller 61 makes the transfer device 16 stand by in front of the transit unit 14 until the timer for "a4" actuated in the process S203*a* is timed out (process S203*c*).

When the timer for "a4" is timed out in the process S203c, the controller 61 starts the process S204. In the process S204, the controller 61 first actuates a timer for the operation time "a6" (process S204a). Subsequently, the controller 61 places the wafer W on the transit unit 14 (process S204b). Then, the controller 61 makes the transfer device 16 stand by in front of the transit unit 14 until the timer for "a6" actuated in the process S204a is timed out (process S204c).

Herein, the third transfer processing has been described as an example, but the same is applied to the first transfer processing and the second transfer processing. That is, in the first transfer processing, the controller 61 moves the transfer device 16 from the transit unit 14 to the liquid processing unit 17, and then, makes the transfer device 16 stand by until a predetermined period of time elapses from the start of the first transfer processing. Further, in the second transfer processing, the controller 61 moves the transfer device 16 from the liquid processing unit 17 to the drying unit 18, and then, makes the transfer device 16 stand by until a predetermined period of time elapses from the start of the second transfer processing.

By controlling as described above, the transfer times of the first to third transfer processings can be fixed. In other words, it is possible to suppress an increase or a decrease in transfer time of the first to third transfer processings. Accordingly, it is possible to suppress a fluctuation in a transfer cycle of the wafers W and thus possible to stably transfer the wafers W on a predetermine cycle.

As described above, a substrate processing apparatus (for example, substrate processing system 1) includes a transit unit (for example, transit unit 14); multiple liquid processing units (for example, liquid processing units 17); multiple drying units (for example, drying units 18); a transfer device (for example, transfer device 16) and a controller (for example, controller 61). The transit unit is configured to accommodate therein multiple substrates (for example, wafer 17). The multiple liquid processing units are configured to form a liquid film on a surface of the substrate. The multiple drying units are configured to dry the substrate by bringing the substrate having the liquid film formed on the surface thereof into contact with a supercritical fluid. The transfer device is configured to transfer the substrate. The controller is configured to control the transit unit, the multiple liquid processing units, the multiple drying units and the transfer device to perform two recipes, which includes a first recipe (for example, one of the recipe A or the recipe B) and a second recipe (for example, the other of the recipe A or the recipe B), in parallel, each of the first recipe and the second recipe including a first transfer processing of transferring the substrate from the transit unit to the liquid processing unit, a liquid processing performed by the liquid processing unit, a second transfer processing of transferring the substrate from the liquid processing unit to the drying unit and a drying processing performed by the drying unit, the first recipe and the second recipe having different processing times of at least the liquid processing and the drying processing. Further, the controller determines, while the first recipe on a first substrate in the multiple substrates is being performed, when the second recipe on a second substrate in the multiple substrates is started, a start timing of the first transfer processing of the second substrate such that a time period of the second transfer processing of the first substrate does not overlap with a time period of the second transfer processing of the second substrate.

Further, when an interval between an expected start timing of the second transfer processing of the second substrate when it is assumed that the first transfer processing of the second substrate is started and a start timing of the second transfer processing of the first substrate is shorter than a predetermined interval time (for example, interval time I), the controller starts the first transfer processing of the second substrate at a timing when the interval becomes equal to or longer than the interval time.

Therefore, in the substrate processing apparatus according to the exemplary embodiment, the non-uniformity in transfer time of the wafer having the liquid film on its surface can be suppressed even when the plurality of recipes having different processing times is performed in parallel.

The controller may start the first transfer processing of the second substrate at the timing when the interval becomes equal to or longer than the interval time such that the second transfer processing of the second substrate is started after the second transfer processing of the first substrate is ended.

Accordingly, it is possible to suppress the processing of the subsequent substrate from overtaking the processing of the preceding substrate. Therefore, it is possible to suppress, for example, the complexity of the system.

When the start timing of the first transfer processing is included in a transfer prohibition period ending at a start timing of the second transfer processing of another one of the multiple substrates assuming that the first transfer processing of the second substrate is started at the timing when the interval becomes equal to or longer than the interval time, the controller may start the first transfer processing of the second substrate after the second transfer processing of the another one of the multiple substrates is ended.

Accordingly, the second transfer processing of the preceding substrate can be started more reliably at the expected start timing.

The recipe may include a third transfer processing of transferring the substrate from the drying unit to the transit unit. In this case, when the first recipe on a third substrate in the multiple substrates is started during the drying processing of the first substrate, the controller may start the first transfer processing of the third substrate such that the liquid processing of the third substrate is ended within a predetermined period of time after the third transfer processing of the first substrate is ended.

Accordingly, the start of the second transfer processing of the subsequent substrate is delayed, for example, until the third transfer processing of the preceding substrate is ended. Therefore, it is possible to suppress the non-uniformity in processing time of the second transfer processing of the subsequent substrate.

When both the first recipe and the second recipe are allowed to be started, the controller may start performing the recipe other than the recipe performed last between the first recipe and the second recipe.

Accordingly, it is possible to suppress the difference in progress between the recipe A and the recipe B.

In the first transfer processing, the controller may move the transfer device from the transit unit to the liquid processing unit, and then, make the transfer device stand by until a predetermined period of time elapses from a time when the first transfer processing is started. Further, in the second transfer processing, the controller may move the transfer device from the liquid processing unit to the drying unit, and then, make the transfer device stand by until a predetermined period of time elapses from a time when the second transfer processing is started.

Accordingly, it is possible to suppress the increase or the decrease in transfer time of the first to third transfer processings. Accordingly, it is possible to suppress the fluctuation in the transfer cycle of the substrates, and thus, possible to stably transfer the substrates on the predetermine cycle.

While the present disclosure has been described with reference to the exemplary embodiments, the present disclosure is not limited to the exemplary embodiments but may be variously modified without departing from the spirit thereof. For example, in the above-described exemplary embodiment, the substrate processing system 1 is provided with one transfer device 16. However, the number of transfer devices 16 is not limited to one. A plurality of transfer devices 16 may be provided as long as they are provided in common for the liquid processing unit 17 and drying unit 18 in each of the plurality of pairs.

The exemplary embodiments disclosed herein are illustrative in all aspects and do not limit the present disclosure. In fact, the above exemplary embodiments can be embodied in various forms. Further, the above-described exemplary embodiments may be omitted, replaced and modified in various ways without departing from the scope and the spirit of the appended claims.

According to the present disclosure, it is possible to suppress non-uniformity in transfer time of a wafer having a liquid film on its surface even when a plurality of recipes having different processing times is performed in parallel.

We claim:

1. A substrate processing apparatus, comprising:
a transit unit configured to accommodate therein multiple substrates;
multiple liquid processing units each configured to form a liquid film on a surface of the substrate;
multiple drying units each configured to dry the substrate by bringing the substrate having the liquid film formed on the surface thereof into contact with a supercritical fluid;
a transfer device configured to transfer the substrate; and
a controller configured to control the transit unit, the multiple liquid processing units, the multiple drying units and the transfer device to perform two recipes, which includes a first recipe and a second recipe, in parallel, each of the first recipe and the second recipe including a first transfer processing of transferring the substrate from the transit unit to the liquid processing unit, a liquid processing performed by the liquid processing unit, a second transfer processing of transferring the substrate from the liquid processing unit to the drying unit and a drying processing performed by the drying unit, the first recipe and the second recipe having different processing times of at least the liquid processing and the drying processing,
wherein while the first recipe on a first substrate in the multiple substrates is being performed, when the second recipe on a second substrate in the multiple substrates is started, the controller determines a start timing of the first transfer processing of the second substrate such that a time period of the second transfer processing of the first substrate does not overlap with a time period of the second transfer processing of the second substrate.

2. The substrate processing apparatus of claim 1,
wherein when an interval between an expected start timing of the second transfer processing of the second substrate when it is assumed that the first transfer processing of the second substrate is started and a start timing of the second transfer processing of the first substrate is shorter than a predetermined interval time, the controller starts the first transfer processing of the second substrate at a timing when the interval becomes equal to or longer than the interval time.

3. The substrate processing apparatus of claim 2,
wherein the controller starts the first transfer processing of the second substrate at the timing when the interval becomes equal to or longer than the interval time such that the second transfer processing of the second substrate is started after the second transfer processing of the first substrate is ended.

4. The substrate processing apparatus of claim 2,
wherein when the start timing of the first transfer processing of the second substrate is included in a transfer prohibition period ending at a start timing of the second transfer processing of another one of the multiple substrates assuming that the first transfer processing of the second substrate is started at the timing when the interval becomes equal to or longer than the interval time, the controller starts the first transfer processing of the second substrate after the second transfer processing of the another one of the multiple substrates is ended.

5. The substrate processing apparatus of claim 1,
wherein the recipe includes a third transfer processing of transferring the substrate from the drying unit to the transit unit, and
when the first recipe on a third substrate in the multiple substrates is started during the drying processing of the first substrate, the controller starts the first transfer processing of the third substrate such that the liquid processing of the third substrate is ended within a predetermined period of time after the third transfer processing of the first substrate is ended.

6. The substrate processing apparatus of claim 1,
wherein when both the first recipe and the second recipe are allowed to be started, the controller starts performing the recipe other than the recipe performed last between the first recipe and the second recipe.

7. The substrate processing apparatus of claim 1,
wherein, in the first transfer processing, the controller moves the transfer device from the transit unit to the liquid processing unit, and then, makes the transfer device stand by until a predetermined period of time elapses from a time when the first transfer processing is started.

8. The substrate processing apparatus of claim 1,
wherein, in the second transfer processing, the controller moves the transfer device from the liquid processing unit to the drying unit, and then, makes the transfer device stand by until a predetermined period of time elapses from a time when the second transfer processing is started.

9. A substrate processing method, comprising:
performing two recipes, which includes a first recipe and a second recipe, in parallel, each of the first recipe and the second recipe including a first transfer processing of transferring a substrate of multiple substrates from a transit unit configured to accommodate therein the multiple substrates to any one of multiple liquid processing units each configured to form a liquid film on a surface of the substrate by using a transfer device; a liquid processing performed by the liquid processing unit; a second transfer processing of transferring the substrate from the liquid processing unit to any one of multiple drying units each configured to dry the substrate by bringing the substrate into contact with a supercritical fluid by using the transfer device; and a drying processing performed by the drying unit, the first recipe and the second recipe having different processing times of at least the liquid processing and the drying processing, wherein the performing of the two recipes in parallel includes:

while the first recipe on a first substrate in the multiple substrates is being performed, when the second recipe on a second substrate in the multiple substrates is started, determining a start timing of the first transfer processing of the second substrate such that a time period of the second transfer processing of the first substrate does not overlap with a time period of the second transfer processing of the second substrate; and starting the first transfer processing of the second substrate at the start timing determined in the determining of the start timing.

* * * * *